(12) United States Patent
Shu et al.

(10) Patent No.: US 8,804,783 B2
(45) Date of Patent: Aug. 12, 2014

(54) COOLING APPARATUS FOR OPTICALLY PUMPED SEMICONDUCTOR LASER

(75) Inventors: Qi-Ze Shu, Cupertino, CA (US); Charles King, Bolton, CA (US)

(73) Assignee: Coherent, Inc., Santa Clarent, CA (US)

( * ) Notice: Subject to any disclaimer, the term of this patent is extended or adjusted under 35 U.S.C. 154(b) by 270 days.

(21) Appl. No.: 13/084,235

(22) Filed: Apr. 11, 2011

(65) Prior Publication Data

US 2012/0257647 A1    Oct. 11, 2012

(51) Int. Cl.
*H01S 3/04*    (2006.01)

(52) U.S. Cl.
USPC .................................. 372/36; 372/34; 372/35

(58) Field of Classification Search
CPC .................... H01S 5/02469–5/02492
USPC .................................. 372/36, 34, 35
See application file for complete search history.

(56) References Cited

U.S. PATENT DOCUMENTS

| | | | |
|---|---|---|---|
| 3,895,313 A * | 7/1975 | Seitz | 372/103 |
| 5,089,861 A * | 2/1992 | Tanaka et al. | 372/36 |
| 5,436,920 A | 7/1995 | Minemoto et al. | |
| 5,627,853 A | 5/1997 | Mooradian et al. | |
| 6,097,742 A | 8/2000 | Caprara et al. | |
| 6,285,702 B1 * | 9/2001 | Caprara et al. | 372/92 |
| 6,782,019 B2 | 8/2004 | Zheng | |
| 6,940,880 B2 | 9/2005 | Butterworth et al. | |
| 2005/0190810 A1 | 9/2005 | Butterworth et al. | |
| 2005/0276301 A1 | 12/2005 | Spinelli et al. | |
| 2006/0251140 A1 * | 11/2006 | Lee | 372/70 |
| 2007/0291801 A1 | 12/2007 | Caprara et al. | |
| 2008/0112443 A1 | 5/2008 | Lee et al. | |
| 2009/0067453 A1 | 3/2009 | Mizuuchi et al. | |
| 2010/0002742 A1 * | 1/2010 | Basu | 372/67 |
| 2010/0202479 A1 * | 8/2010 | Miyajima et al. | 372/35 |
| 2011/0064099 A1 | 3/2011 | Govorkov et al. | |

FOREIGN PATENT DOCUMENTS

JP    2003-309316 A    10/2003

OTHER PUBLICATIONS van Loon et al. ("Intracavity diamond heatspreaders in lasers: the effects of birefringence", Optics Exp., vol. 14, Issue 20, pp. 9250-9260, 2006).*

Maclean et al. ("Limits on efficiency and power scaling in semiconductor disk lasers with diamond heatspreaders", J. Opt. Soc. Am. B/vol. 26, No. 12, Dec. 2009).*

Final Office Action received for U.S. Appl. No. 12/558,315, mailed on Mar. 11, 2011, 13 pages.

Non Final Office Action received for U.S. Appl. No. 12/558,315, mailed on Oct. 4, 2010, 16 pages.

(Continued)

*Primary Examiner* — Tod T Van Roy
(74) *Attorney, Agent, or Firm* — Morrison & Foerster LLP (57) ABSTRACT

An OPS-chip is soldered mirror-structure-side down on an upper surface of diamond-heat spreader. A metal frame is also soldered to the upper surface of the heat-spreader. The lower surface of the diamond heat-spreader is either soldered to, or clamped against, a surface of a heat-sink. The dimensions of the frame and the heat spreader are selected such that at a solidification temperature of the solder at the center of the upper surface of the heat-spreader has an effective CTE comparable with that of the OPS-chip. The lower surface of the heat-spreader can be soldered to the heat sink surface or clamped against the heat-sink surface by the frame.

10 Claims, 6 Drawing Sheets

(56) References Cited

OTHER PUBLICATIONS

Hastie et al., "High power CW red VECSEL with linearly polarized TEM00 output beam", Optics Express, vol. 13, No. 1, Jan. 10, 2005, pp. 77-81.

Hopkins, et al. "High-power, (AlGaIn)(AsSb) semiconductor disk laser at 2.0 μm", Optics Letters, vol. 33, No. 2, Jan. 15, 2008, pp. 201-203.

International Search Report and Written Opinion received for PCT Patent Application No. PCT/US2012/032221, mailed on Dec. 21, 2012, 10 pages.

Kemp et al., "Thermal Management in 2.3—μm Semiconductor Disk Lasers: A Finite Element Analysis", IEEE Journal of Quantum Electronics, vol. 44, No. 2, Feb. 2008, pp. 125-135.

MacLean et al., "Limits on Efficiency and Power Scaling in Semiconductor Disk Lasers with Diamond Heat Spreaders", Journal of the Optical Society of America B, vol. 26, No. 12, Dec. 2009, pp. 2228-2236.

Minteq International Inc., "Pyroid HT Pyrolytic Graphite Metallized Heat Spreaders", available online at <http://www.globalspec.com/FeaturedProducts/Detail/MINTEQ/PYROID_HT_Pyrolytic_Graphite_Heat_Spreaders/95268/0>, May 26, 2009, 1 page.

Rautiainen et al., "1 W at 617 nm Generation by Intracavity Frequency Conversion in Semiconductor Disk Laser", Electronics Letters, vol. 43, No. 18, Aug. 31, 2007, 2 pages.

\* cited by examiner

COOLING APPARATUS FOR OPTICALLY PUMPED SEMICONDUCTOR LASER

TECHNICAL FIELD OF THE INVENTION

The present invention relates in general to external cavity, surface emitting optically pumped semiconductor lasers (OPS-lasers) having a semiconductor chip (OPS-chip) including a multilayer gain-structure surmounting a mirror structure. The invention relates in particular to methods and apparatus for cooling the OPS-chip during operation.

DISCUSSION OF BACKGROUND ART

OPS-lasers are increasingly being used instead of solid-state lasers to provide high-power continuous-wave (CW) laser radiation. OPS-lasers can provide an output beam of very high-quality. The lasers may be operated in a fundamental mode or in an intra-cavity frequency-converted mode.

An OPS-laser employs as a gain-medium an epitaxially grown, multilayer semiconductor gain-structure including active layers spaced apart by pump-radiation absorbing layers. The gain-structure is surmounted on a mirror-structure and the gain-structure and mirror-structure are commonly referred to by practitioners of the art as an OPS-chip. The mirror structure may be formed from epitaxially grown semiconductor layers, dielectric layers, or a combination of metal and dielectric layers.

The gain-structure of the OPS-chip is optically pumped by radiation from an edge-emitting semiconductor laser (diode-laser) or an array thereof. The radiation may be focused directly from the diode-laser or array. The radiation may also be delivered from the diode-laser or array by an optical fiber or an optical fiber bundle, and then focused on the gain-structure. Although OPS-lasers have a relatively high optical- (pump-to-output) efficiency, absorbed pump-radiation that is not converted to laser radiation generates heat, and that heat is generated in a relatively small volume of material. Because of this, an efficient cooling arrangement is essential for an OPS-chip.

Typically, the OPS-chip is soldered onto diamond heat-spreader which in turn is soldered onto a copper heat-sink. The diamond heat-spreader assists the transfer of heat from the OPS-chip to the copper heat-sink by laterally spreading the heat away from the area of the chip in which the heat is generated (the pump-radiation spot or simply pump-spot). The heat-sink may be simply a massive, passive heat-sink, or may be an actively cooled heat-sink. An extensive description of OPS-lasers, including heat-sink arrangements with a diamond heat-spreader, is provided in U.S. Pat. No. 6,097,742, assigned to the assignee of the present invention, and the complete disclosure of which is hereby incorporated herein by reference.

All else being equal, the thicker a diamond heat-spreader the more efficient is the heat transfer from the OPS-chip to the copper heat-sink. A problem limiting the thickness of a diamond heat-spreader, however, is a mismatch of coefficients of thermal expansion (CTEs) between the copper heat-sink, the diamond heat-spreader, and the OPS-chip. If the CTE-mismatch is not compensated, an OPS-chip can be become curved, buckled, or even detached from the diamond heat-spreader. This will cause a performance decrease, or even catastrophic failure, of the OPS-laser.

It has been found that for any OPS-chip there is a particular thickness of diamond heat-spreader that will provide an "effective CTE" of the combination of the diamond and copper which matches the CTE of that OPS-chip. That diamond-thickness, however, is less than would be an ideal thickness for optimum heat-spreading of the OPS-chip.

Assuming that the effective CTE is made such that detachment of the OPS-chip does not occur, a limiting factor in how much power can be extracted from an OPS-chip is a phenomenon known to practitioners of the art as "thermal roll-off", which occurs when total pump-power (and heat generated) rises to a certain level. As the pump-power is increased from a threshold value, output power increases in a more or less linear relationship to the pump-power, until, at a certain level, power increase is rapidly reduced by thermally induced absorption in the semiconductor materials of the OPS-chip. At pump-powers beyond that level, output power decreases, eventually falling to zero. There is a need for a heat-sink arrangement which will provide more efficient heat transfer from an OPS-chip to a heat-sink, and thereby increase the pump-power level (and corresponding output power) at which the onset of thermal roll-off occurs.

SUMMARY OF THE INVENTION

One aspect of an apparatus in accordance with the present invention comprises a heat-sink having a heat-sink surface. A diamond heat-spreader having first and second opposite surfaces is provided. An OPS-chip having a multilayer semiconductor gain-structure surmounting a mirror structure, has the mirror structure thereof soldered by a hard solder to the second surface of the diamond heat-spreader. The first surface of the diamond heat-spreader is in thermal communication with the heat-sink surface. A metal frame is soldered to the second surface of the diamond heat-spreader by the hard solder. The dimensions of the metal frame and the dimensions of the diamond heat-spreader are selected such that, at a solidification temperature of the hard solder, the diamond heat-spreader, at the center of the second surface thereof, has an effective coefficient of expansion (CTE) about the same as that of the OPS-chip.

In one preferred embodiment of the inventive apparatus, the metal frame and the first surface of the diamond heat-spreader are also soldered to the heat-sink surface. In another preferred embodiment of the inventive apparatus the metal frame is attached to the heat-sink surface in a manner such that the metal-frame clamps the diamond heat-spreader on the heat-sink with the first surface of the diamond heat-spreader in thermal communication with the heat-sink.

Creating the effective CTE match between the diamond heat-spreader using the metal frame soldered to the diamond heat-spreader, provides that a thicker diamond spreader can be used than is possible in prior-art arrangements without the soldered metal frame. This improves conduction of heat away from the OPS-chip while the OPS-chip is being optically pumped. Experimental results discussed herein below indicate that the improved conduction raises the pump-power at which thermal roll-off occurs by at least about 25% compared with prior-art arrangements.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 1:
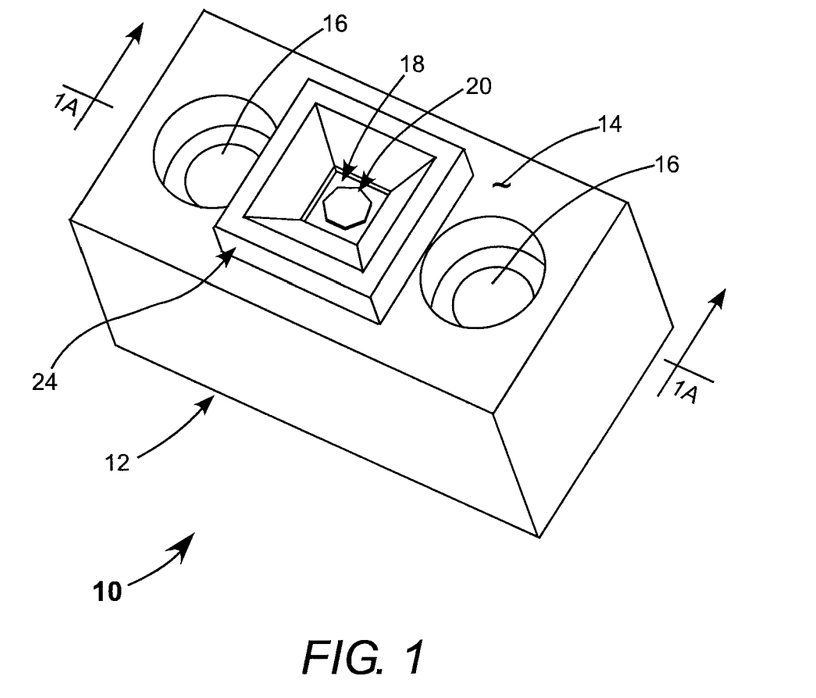
FIG. 1 is an isometric view schematically illustrating one preferred embodiment of a cooling arrangement in accordance with the present invention for an OPS-chip including a heat-sink, a diamond heat-spreader having first and second opposite surfaces with the first surface soldered to the heat-sink, an OPS-chip soldered to the second surface of the diamond heat-spreader, and a metal frame soldered to the second surface of the diamond heat-spreader and to the heat-sink.
Figure 1A:
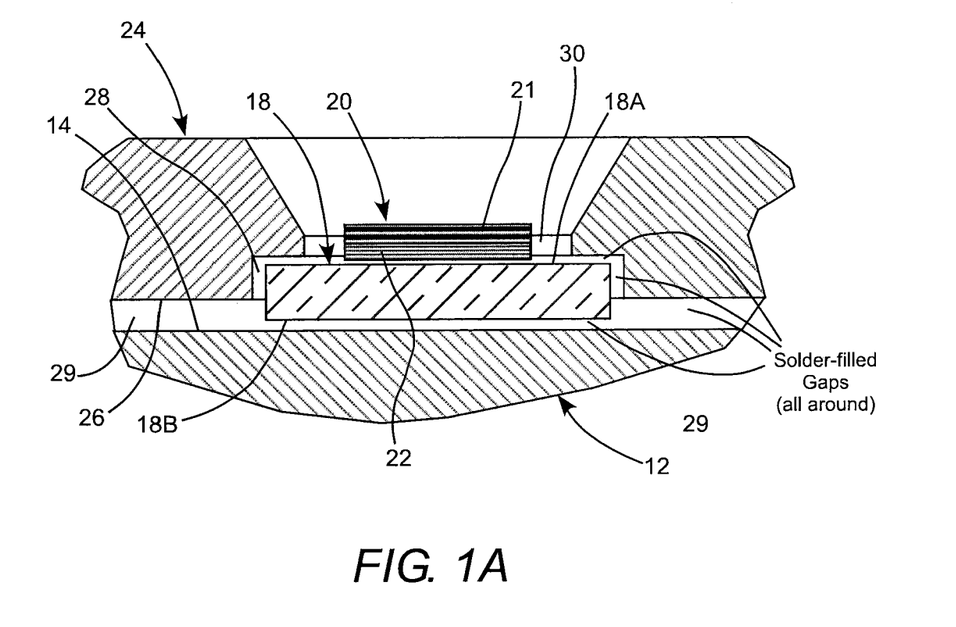
FIG. 1A is a fragmentary cross-section view, seen generally in the direction 1A-1A of FIG. 1, schematically illustrating further detail of the heat-sink, OPS-chip, diamond heat-spreader, and metal frame of FIG. 1.

Referring now to the drawings, wherein like components are designated by like reference numerals, FIG. 1 and FIG. 1A schematically illustrates a preferred embodiment 10 of a conduction-cooled OPS-chip arrangement in accordance with the present invention. Arrangement 10 includes a relatively massive heat-sink 12, preferably of copper (Cu). Stepped apertures 16 are provided for bolting the arrangement into laser apparatus, or to an optional water-cooled chiller (not shown). A diamond heat-spreader 18 is soldered to upper surface 14 of the heat-sink via bottom surface 18B thereof. Preferably the diamond heat-spreader has a thickness greater than about 0.2 mm (200 μm) and more preferably greater than about 0.3 mm (300 μm).

An OPS-chip 20 is soldered to diamond heat-spreader 18 on top surface 18A thereof. Here, the OPS-chip is depicted as being heptagonal. This is a useful shape for preventing parasitic lateral oscillation when the chip is operated at high power in a laser resonator. OPS-chip includes an epitaxially grown, multilayer semiconductor gain-structure 21, and a mirror structure 22, as discussed above. The OPS-chip is soldered mirror-structure-side down to the diamond heat-spreader and is in thermal communication with the diamond heat-spreader via the solder bonding. A metal frame 24 is soldered to upper surface 18A of the diamond heat-spreader and to upper surface 14 of heat-sink 12. In this configuration, gap 29 between surface 14 of heat-sink 12, and space between the frame and the diamond heat-spreader and frame 24 will be solder-filled. The solder is not depicted for simplicity of illustration. It should be noted here that dimensions of components of arrangement 10 as depicted in FIGS. 1 and 1A are relatively, approximately to scale, with the exception of the OPS-chip thickness which is exaggerated (particularly in FIG. 1A) for convenience of illustration. By way of example, an OPS-chip for 1064-nanometer (nm) operation has a physical thickness of about 7 μm.

The OPS-chip can be operated such that mirror structure 22 thereof is an end mirror of a linear laser-resonator, a fold-mirror of a folded linear resonator, or any one mirror of a ring-laser resonator. In each case, the gain-structure will be in the resonator. Examples of linear resonators including OPS-chips are described in above-referenced U.S. Pat. No. 6,097,742. Examples of ring-resonators including OPS-chips are described in U.S. Pat. No. 6,940,880, also assigned to the assignee of the present invention, and the complete disclosure of which is hereby incorporated herein by reference.

Figure 2A:
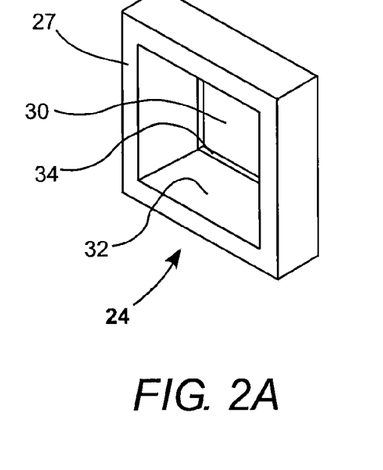
FIG. 2A is an isometric view schematically illustrating detail of the top of the metal frame of FIG. 1.
Figure 2B:
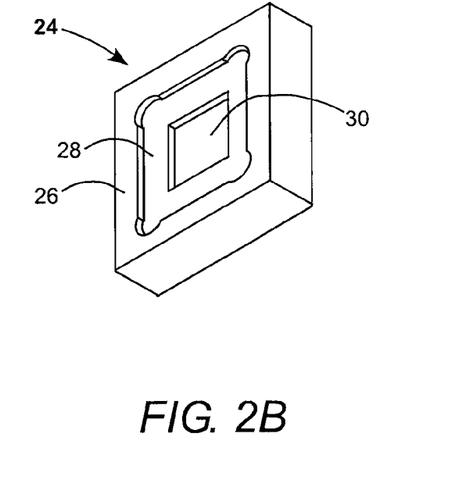
FIG. 2B is an isometric view schematically illustrating detail of the bottom of the metal frame of FIG. 1.

Continuing with reference in particular to FIG. 1A, and with reference in addition to FIG. 2A and FIG. 2B, frame 24 has a recess 28 in base 26 thereof. The recess is large enough in area to accommodate the diamond heat-spreader. The recess preferably has a depth slightly less than the thickness of the diamond heat-spreader. An aperture 30 in the frame is large enough to accommodate the OPS-chip, but sufficiently small that the frame covers the diamond heat-spreader over at least some part of the periphery of the heat-spreader, and preferably over the entire periphery thereof. Aperture 30 has a straight edge 34. Walls 32 slope away from the aperture-edge to the top edge 27 of the frame.

Figure 2C:
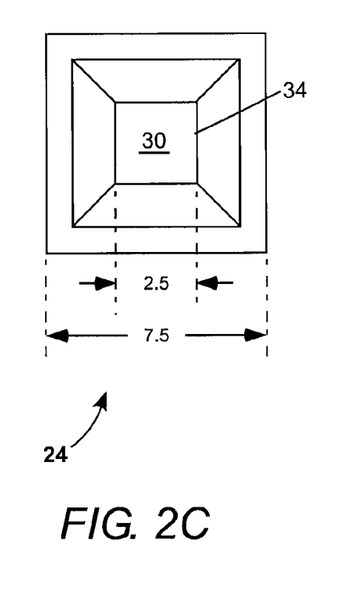
FIG. 2C is a plan view from above schematically illustrating dimensions of one example of the metal frame of FIGS. 2A and 2B.
Figure 2D:
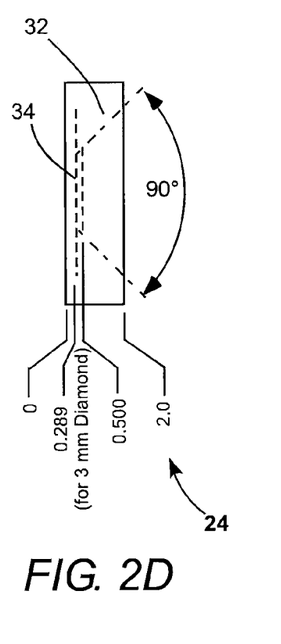
FIG. 2D is a side-elevation view schematically illustrating dimensions of one example of the metal frame of FIGS. 2A and 2B.
Figure 2E:
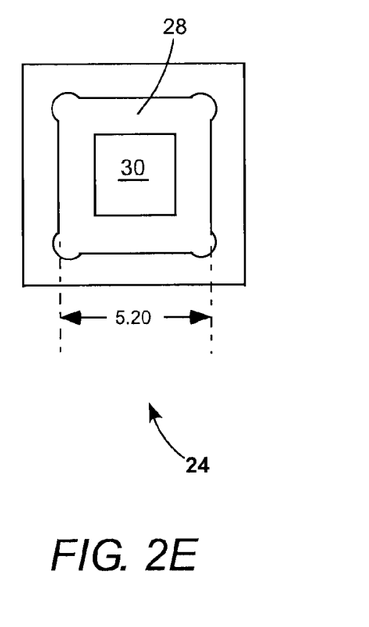
FIG. 2E is a plan view from above schematically illustrating dimensions of one example of the metal frame of FIGS. 2A and 2B.

FIG. 2C, FIG. 2D, and FIG. 2E schematically illustrate dimensions for one example of frame 24. Here, the frame is square with an side-dimension of 7.5 mm. Aperture 30 is square with a side-dimension of 2.5 mm. Recess 28 is square with 270-degree radiused corners. The side-dimension is 5.2 mm. Recess 28 has a depth dependent on the thickness of the diamond heat-spreader. The depth is about 0.298 mm for a 3 mm-thick heat-spreader and about 0.389 mm for a 4 mm-thick heat-spreader. The top of the aperture is 0.5 mm above the base of the frame. The total thickness of the frame is 2.0 mm. The included angle of walls 32 is 90°. These dimensions are assumed in calculations, results of which are discussed further hereinbelow. It is assumed in these calculations that the heat-sink is made from copper and the frame is made from steel.

In a preferred method of assembling an arrangement 10, all solder joint faces are gold plated for soldering with a "hard solder" for example a solder comprising 80% gold (Au) and 20% tin (Sn), with percentages by weight. Solder pre-forms are used for diamond to heat-sink and steel frame to heat-sink joints. Upper surface 18A of the diamond heat-spreader is deposited with a AuSn solder layer. OPS-chip 20, still on a growth-substrate is positioned on the solder covered diamond heat-spreader. Filling gaps between the edge of the diamond heat-spreader and the recess in the frame is optional. The assembly is then heated to effect reflow soldering, and then cooled such that the steel frame, the diamond heat-spreader, the copper heat-sink, and the OPS-chip are all mechanically joined together to form a solid structure. Then the growth substrate of the OPS-chip is etched away, revealing the gain-structure as depicted.

Diamond is an unique material with Young's modulus of 1220 Gpa, CTE of about 1 ppm/K, and thermal conductivity of about 2000 W/(m·K). For copper, these values are about 120 Gpa, 17 ppm/K, and 400 W/(m·K). Metal frame 24 has a similar CTE to that of the copper heat-sink. At upper surface 18A of the diamond heat-spreader, the joined structure produces an effective CTE which can match that of the principal semiconductor material, for example, gallium arsenide (GaAs), of the OPS chip. The CTE of GaAs is about 6 ppm/K. The effective CTE is a function of thickness of the diamond heat-spreader. Without the frame, as in prior-art arrangements, the optimum thickness of the diamond heat-spreader is about 0.16 mm. With metal frame 24 in the inventive arrangement, the diamond heat-spreader thickness can be increased to above 0.5 mm, if necessary.

Figure 3:
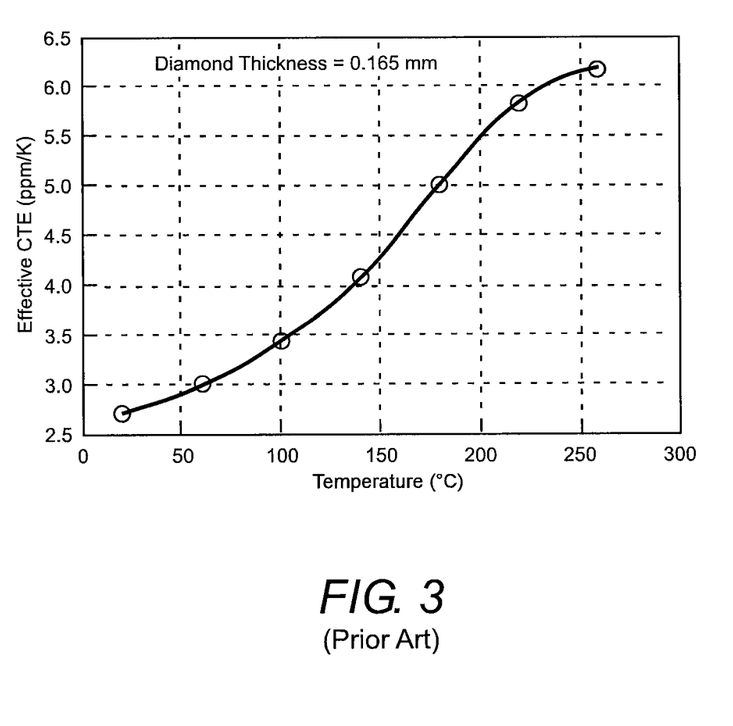
FIG. 3 is a graph schematically illustrating calculated effective CTE as a function of temperature at the center of the second surface of the diamond heat-spreader, at the interface between that surface and the OPS-chip, in a prior-art cooling arrangement without the inventive metal frame, and a diamond heat-spreader thickness of about 160 micrometers (μm).

FIG. 3 is a graph schematically illustrating calculated effective CTE as a function of temperature at the center of the second surface of the diamond heat-spreader, at the interface between that surface and the OPS-chip, in a prior-art cooling arrangement without the inventive metal frame, and with a diamond heat-spreader thickness of about 165 micrometers (μm). The calculation was done using finite element analysis (FEA) with simulation software available from COMSOL of Palo Alto, Calif. The temperatures are temperatures during cool down from the solidification temperature of AuSn solder (about 280° C.) and assume some yield between the copper of the heat-sink and the solder. In the absence of any yield, the effective CTE at the solidification temperature would be retained. It is assumed in this calculation that the copper heat-sink has dimensions 20.0 mm long, by 10.0 mm wide, by 10.0 mm high. It is assumed that the diamond heat-spreader is 2.65 mm square by 0.165 mm (165 μm) thick.

Figure 4:
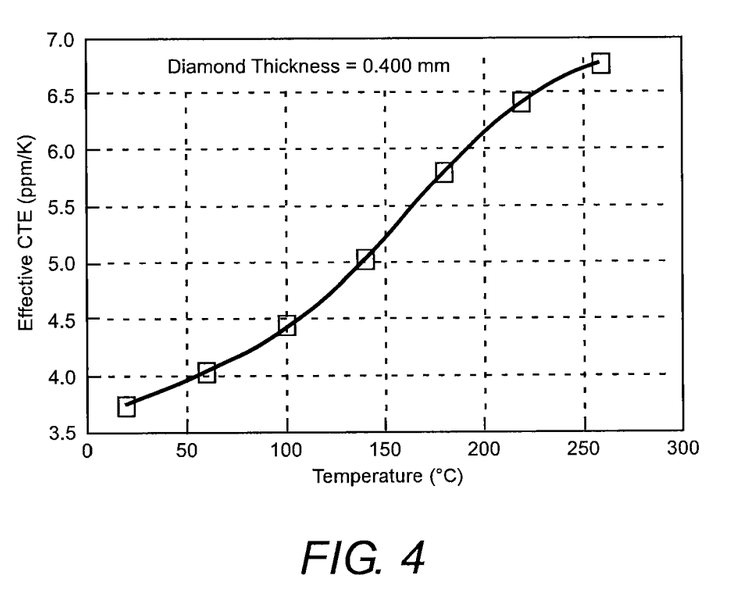
FIG. 4 is a graph schematically illustrating calculated effective CTE as a function of temperature at the center of the second surface of the diamond heat-spreader, at the interface between that surface and the OPS-chip, in the inventive cooling arrangement of FIG. 1, with the metal frame having the exemplary dimensions of FIGS. 2C-E and the diamond heat-spreader having a thickness of about 400 μm.

FIG. 4 is a graph schematically illustrating calculated effective CTE as a function of temperature at the center of the second surface of the diamond heat-spreader, at the interface between that surface and the OPS-chip, in the inventive cooling arrangement of FIG. 1, with the metal frame having the exemplary dimensions of above-discussed FIGS. 2C-E, and with the diamond heat-spreader being 5.0 mm square and having a thickness of about 400 μm (0.400 mm). The heat-sink is assumed to be 25.4 mm square by 10.0 mm high. Any dimension of the heat-sink greater than 10.0 mm will have no significant effect on the effective CTE accordingly the results of FIGS. 3 and 4 can be reliably compared. Comparing FIGS. 3 and 4, it can be seen that at, or just below, the solidification temperature of the AuSn solder the effective CTE in each case is comparable with the CTE of GaAs. In the case of FIG. 4, however, the diamond heat-spreader has more than twice the thickness than is assumed in the case of FIG. 3, which should provide improved cooling.

It should be noted here that the form of the CTE-function below solidification temperature in both FIGS. 3 and 4 is somewhat arbitrary, because of an uncertainty of the yield-strength parameters used in the calculations, and complexity of the material yielding properties. If only the CTE without yield is considered, it can be predicted that the CTE in the prior-art case is about 6.2 ppm/K compared with about 6.7 ppm/K in the inventive case. The thermal resistance in the prior-art case (assuming a 0.4 mm diameter pump-spot or heating-spot) is about 1.77 K/W in the prior-art case compared with about 1.52 K/W in the inventive case. Absorbed power (again for the 0.4 mm heating spot) required to provide a temperature rise of 80° C. at the diamond/chip interface is about 45.0 W in the prior-art case compared with about 53.0 W in the inventive case.

Figure 5:
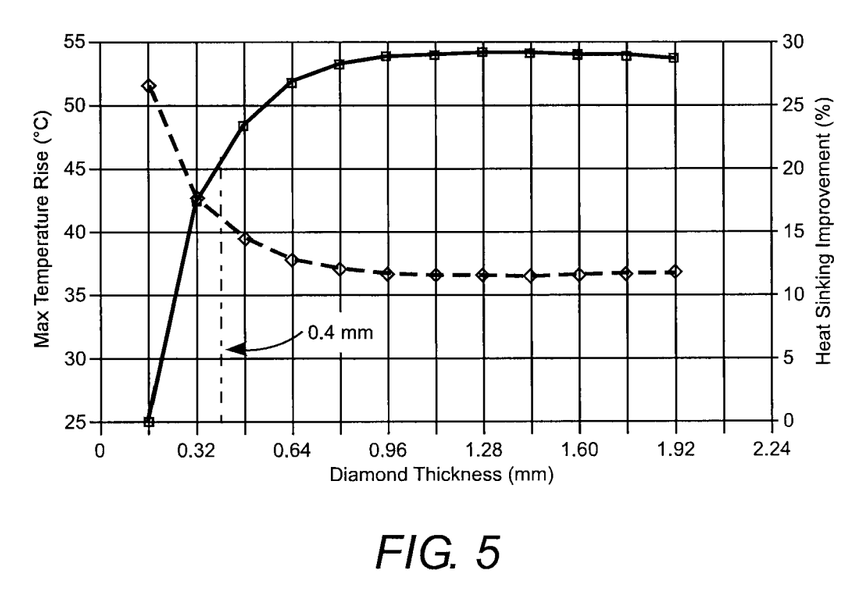
FIG. 5 a graph schematically illustrating calculated maximum temperature-rise and heat-sinking improvement as a function of diamond heat-spreader thickness, at the center of the second surface of the diamond heat-spreader, at the interface between that surface and the OPS-chip, in the inventive cooling arrangement of FIG. 1, assuming the exemplary frame-dimensions of FIGS. 2C-E and one particular pump-spot size and power.

FIG. 5 a graph schematically illustrating calculated maximum temperature-rise (dashed curve) and heat-sinking improvement (solid curve) as a function of diamond heat-spreader thickness, at the center of the second surface of the diamond heat-spreader, at the interface between that surface and the OPS-chip, in the inventive cooling arrangement of FIG. 1. Here, it is assumed that the chip is heated by 50.0 W of radiation in a heating spot diameter of 0.8 mm. The steel-frame dimensions are assumed to be those of FIGS. 2C-E; the diamond heat-spreader is assumed to be 5.0 mm square; and the heat-sink dimensions are assumed to be 10.0 mm wide by 20.0 mm long by 10.0 mm high. Solder layers are not included in the calculation. The temperature rise is calculated relative to that at the base of the heat-sink.

Figure 6:
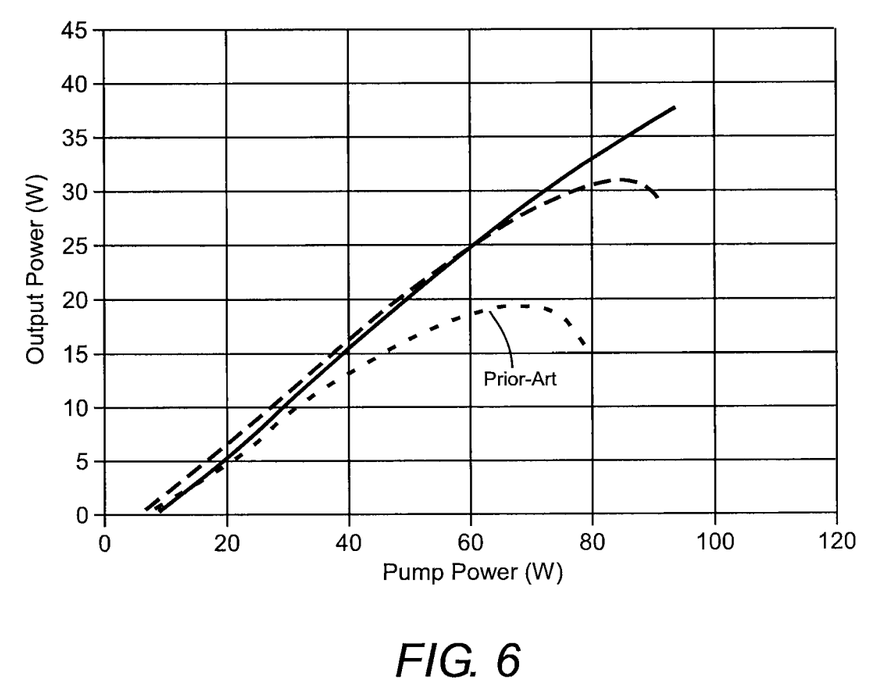
FIG. 6 is a graph schematically illustrating measured power-output as a function of pump-power for an OPS-laser including the inventive cooling arrangement for two different thicknesses of the diamond-heat-spreader, and with a frame having the exemplary dimensions of FIGS. 2C-E.

The graph of FIG. 5 indicates that at a diamond thickness of 0.4 mm as exemplified above, a heat-sinking efficiency improvement of 20% is to be expected. Calculations and predictions aside, a true test of the effectiveness of the cooling arrangement of the present invention is an actual determination of the thermal roll-off power for a prior-art case and an inventive case. Results of such a determination are depicted in FIG. 6, which is a graph schematically illustrating measured power-output as a function of pump-power for an OPS-laser including the inventive cooling arrangement for two different thicknesses of the diamond-heat-spreader, and with a frame having the exemplary dimensions of FIGS. 2C-E. The measured power-output as a function of pump-power for a prior-art case (dotted curve) is depicted for comparison.

The diamond heat-spreader in the prior-art case is 2.65 mm square, and has a thickness of 0.160 mm. In the two inventive cases, the diamond heat-spreader is 5.0 mm square. In one of the inventive cases (dashed curve), the diamond heat-spreader has a thickness of 0.3 mm, and in the other inventive case (solid curve), the diamond heat-spreader has a thickness of 0.4 mm.

In each case, the copper heat-sink has dimensions 20.0 mm by 10.0 mm by 10.0 mm, and the heat-sink itself is mounted on a water-cooled chiller, with an indium wafer clamped between the heat-sink and the chiller to optimize thermal communication therebetween. The water-cooled chiller maintains the base of the heat-sink at a temperature of between 20 to 23° C., depending on the amount of heat generated in the OPS. In each case, the pump-spot has an essentially "flat-topped" intensity distribution with a slightly elliptical cross-section of 0.9 mm by 0.8 mm, and the laser is operated in a highly multimode manner for convenience of thermal comparison. It can be seen from FIG. 6 that in the inventive cases, the onset of thermal roll-off occurs at a pump-power (and corresponding output power) at a minimum 25% higher, and even greater than 30% higher, than in the prior-art case This experimentally demonstrated improvement is even greater than the improvement suggested by the above-described theoretical thermal calculations.

Figure 7:
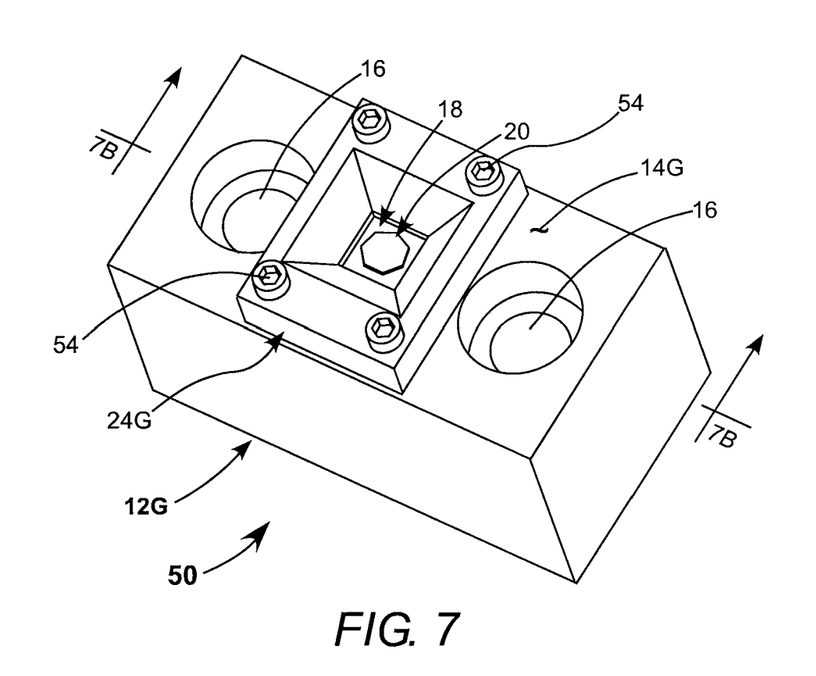
FIG. 7 is an isometric view schematically illustrating another preferred embodiment of a cooling arrangement in accordance with the present invention for an OPS-chip, similar to the embodiment of FIG. 1 but wherein the heat-sink has a pyrolitic carbon insert, the frame and the heat-spreader are not soldered to the heat-sink and the frame is arranged for clamping the diamond heat-spreader against the pyrolitic carbon insert in the heat-sink for maintaining thermal communication of the heat-spreader with the pyrolitic carbon insert.
Figure 7A:
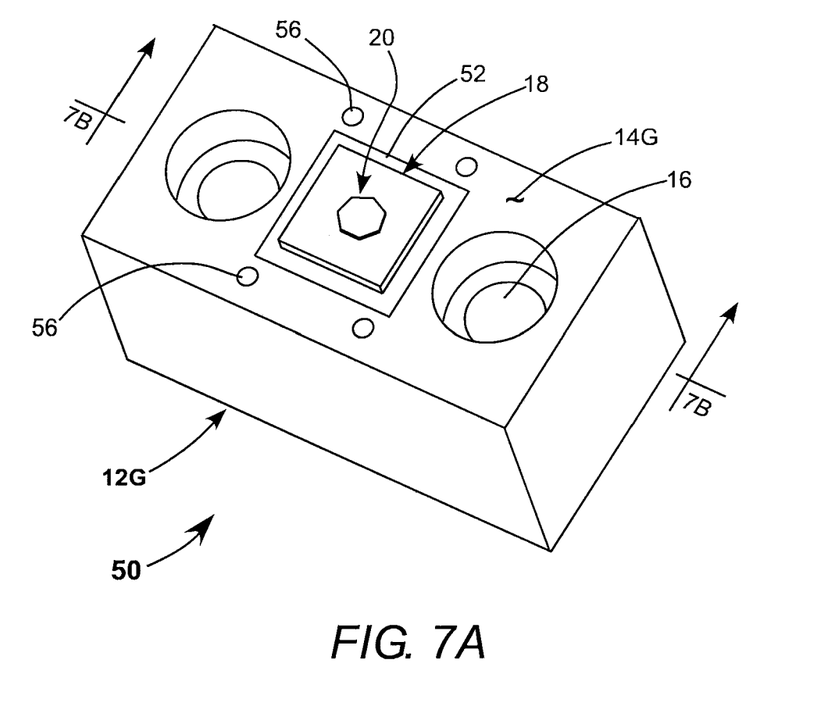
FIG. 7A is an isometric view schematically illustrating the embodiment of FIG. 7 with the frame removed to show the pyrolitic carbon insert.
Figure 7B:
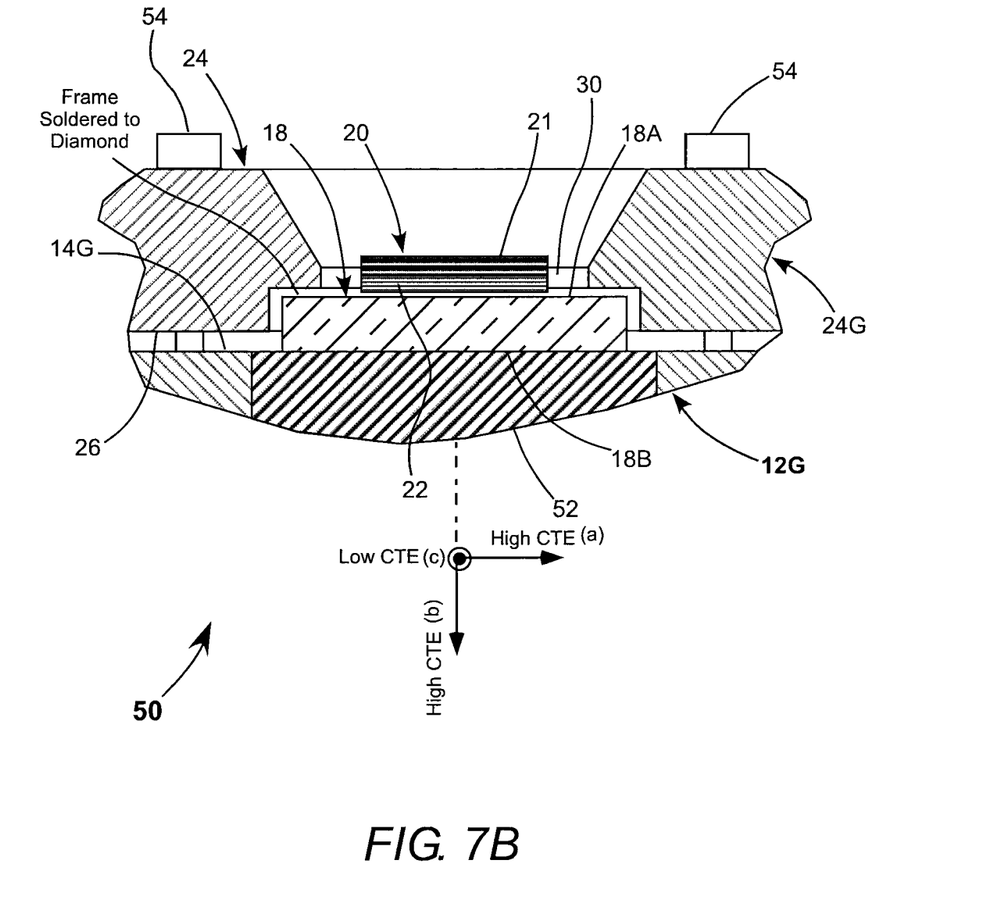
FIG. 7B is a fragmentary cross-section view, seen generally in the direction 7B-7B of FIG. 7, schematically illustrating further detail of the clamping arrangement of FIG. 7 and the pyrolitic carbon insert of FIG. 7A.

FIG. 7, FIG. 7A, and FIG. 7B schematically illustrate another preferred embodiment 50 of a conduction-cooled OPS-chip arrangement in accordance with the present invention. Arrangement 50 is similar to arrangement 10 of FIGS. 1A-B with an exception that heat-sink 12 of arrangement 10 is replaced in arrangement 50 by a heat-sink 12G, which has a pyrolitic carbon (pyrolitic graphite) insert 52 in upper surface 14G of the heat-sink (see FIGS. 7A and 7B). Pyrolitic carbon is an ordered crystalline form of carbon that exhibits very high thermal conductivity of about 1500 W/(m.K) in the a-b plane of the ordered crystals, and an about 100-times lower thermal conductivity in the c-axis. The high value is greater than that of copper and closer to that of diamond. In arrangement 50, pyrolitic carbon insert 52 is arranged with the high-conductivity plane aligned with the length of the heat-sink (see FIG. 7B). The pyrolitic carbon insert has a larger surface area than that of diamond heat-spreader 18.

A problem with the pyrolitic carbon insert is that it is not practical to solder diamond-heat-spreader to the pyrolitic carbon. A solution to this is that frame 25 of arrangement 10 is replaced in arrangement 50 by a frame 24G similar to frame 24 of arrangement 10 but elongated in the width direction of heat-sink 24G to allow the frame to be attached to the heat-sink by screws 54 screwed into threaded holes 56 in heat-sink 12G. Frame 24G is soldered to upper surface 18A of the diamond heat-spreader. Tightening screws 54 effectively clamps lower surface 18B of the diamond heat-spreader against the pyrolitic carbon insert to provide effective thermal communication between the diamond heat-spreader and the pyrolitic carbon insert and accordingly between the diamond-heat-spreader and the heat-sink.

One other solution to the problem of soldering diamond to the pyrolitic carbon would be encase the carbon insert in the heat-sink completely with the copper material of the heat-sink, with only a minimum thickness of copper on the heat-sink surface above the carbon. Such a heat-sink would then simply replace heat-sink 12 in arrangement 10 of FIG. 1.

The present invention is described above with reference to a preferred and other embodiments. The invention is not limited, however, to the embodiments described and depicted. Rather, the invention is limited only by the claims appended hereto.

What is claimed is:

1. Apparatus, comprising:
a copper heat-sink having a heat-sink surface;
a diamond heat-spreader having first and second opposite surfaces and side walls;
an optically pumped semiconductor chip (OPS-chip) having a multilayer semiconductor gain-structure surmounting a mirror structure, the minor structure of the OPS-chip being soldered by a hard solder to the second surface of the heat-spreader and with the first surface of the diamond heat-spreader being soldered to the heat sink surface; and
a steel frame having a top and a base, a recess in the base having dimensions greater than the dimensions of the diamond heat-spreader, said recess having a peripheral shelf and side walls, said steel frame including an aligned aperture having dimensions smaller than the dimensions of the diamond heat spreader, the diamond heat-spreader being soldered by the hard solder into the recess in the frame with the OPS-chip thereon in the aperture of the steel frame, with the second surface of the heat-spreader being bonded to the peripheral shelf and with the side walls of the heat-spreader being bonded to the side walls of the recess and the base of the steel frame being soldered to the heat sink surface, wherein the bonding of the steel frame to the diamond heat-spreader functions to increase the effective coefficient of thermal expansion (CTE) of the diamond heat-spreader.

2. The apparatus of claim 1, wherein the dimensions of the steel frame and the dimensions of the diamond heat-spreader are selected such that, at a solidification temperature of the hard solder, the diamond heat-spreader, at the center of the second surface thereof, has an effective coefficient of expansion (CTE) about the same as that of the OPS-chip.

3. The apparatus of claim 2, wherein the OPS-chip is a GaAs based OPS-chip having a CTE of about 6 ppm/K.

4. The apparatus of claim 1, wherein the diamond heat-spreader has a thickness greater than about 0.3 mm.

5. An apparatus comprising:
a copper heat sink with a planar surface;
an optically pumped semiconductor (OPS-chip);
a diamond heat spreader having first and second opposite surfaces and side walls, said heat spreader being interposed between and bonded to both the heat sink and the OPS chip, said diamond heat spreader having a thickness greater than 0.3 mm; and
a steel frame having a planar surface bonded to the planar surface of the heat sink, said steel frame having a central opening aligned with the OPS chip, said central opening having a peripheral shelf soldered to the surface of the heat spreader opposite to the heat sink, said opening having side walls soldered to the side walls of the heat spreader and wherein the bonding of the steel frame to the diamond heat spreader functions to increase the effective coefficient of thermal expansion (CTE) of the diamond heat spreader.

6. An apparatus as recited in claim 5 wherein the side walls of the central opening of the frame are outwardly tapered in a direction away from the OPS chip.

7. An apparatus comprising:
a copper heat sink with a planar surface;
an optically pumped semiconductor chip (OPS-chip);
a diamond heat spreader interposed between the heat sink and the OPS chip with the upper surface of the head spreader being bonded to the OPS chip and the lower surface of the heat spreader being in thermal communication with the planar surface of the heat sink, said heat spreader having side walls; and
a steel frame having a planar surface soldered to the planar surface of the heat sink, said steel frame having a central opening with dimensions larger than the dimensions of the OPS-chip, said central opening being aligned with the OPS chip, said central opening having a downwardly facing peripheral shelf soldered to the upper surface of the heat spreader in the region surrounding the OPS chip, said central opening having side walls soldered to the side walls of the heat spreader and wherein the bonding of the steel frame to the diamond heat spreader functions to increase the effective coefficient of thermal expansion (CTE) of the diamond heat spreader.

8. The apparatus of claim 7, wherein the lower surface of the heat spreader is soldered to the heat-sink surface.

9. The apparatus of claim 7, wherein the heat-sink surface has a pyrolitic carbon insert therein, and the heat-spreader is clamped in thermal communication with the pyrolitic carbon insert.

10. The apparatus of claim 7 wherein the heat spreader has a thickness greater than 0.3 mm.

* * * * *